United States Patent
Wang et al.

(10) Patent No.: US 7,174,628 B1
(45) Date of Patent: Feb. 13, 2007

(54) MEMORY CARD PRODUCTION USING PREFABRICATED COVER AND MOLDED CASING PORTION

(75) Inventors: Kuang-Yu Wang, Saratoga, CA (US); Jim Ni, San Jose, CA (US); Paul Hsueh, Concord, CA (US); Ren-Kang Chiou, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 154 days.

(21) Appl. No.: 11/071,289

(22) Filed: Mar. 3, 2005

(51) Int. Cl.
*H05K 3/30* (2006.01)

(52) U.S. Cl. ............................. 29/841; 29/830; 29/832; 29/840

(58) Field of Classification Search .................. 29/830, 29/832, 840, 841; 438/127
See application file for complete search history.

(56) References Cited

U.S. PATENT DOCUMENTS

| | | | | |
|---|---|---|---|---|
| 4,769,344 A | * | 9/1988 | Sakai et al. .................... | 29/827 |
| 6,295,221 B1 | * | 9/2001 | Iwasaki et al. ................ | 365/63 |
| 6,444,501 B1 | * | 9/2002 | Bolken ......................... | 438/127 |
| 6,538,311 B2 | * | 3/2003 | Bolken ......................... | 257/679 |
| 6,624,005 B1 | * | 9/2003 | DiCaprio et al. ............ | 438/113 |
| 6,730,995 B2 | * | 5/2004 | Bolken ......................... | 257/679 |
| 6,764,882 B2 | * | 7/2004 | Bolken ......................... | 438/127 |
| 6,977,211 B2 | * | 12/2005 | Williams ...................... | 438/597 |
| 2002/0190429 A1 | * | 12/2002 | Bolken ................... | 264/272.11 |
| 2004/0214372 A1 | * | 10/2004 | Moden ......................... | 438/108 |
| 2005/0022378 A1 | * | 2/2005 | Bolken ......................... | 29/840 |

* cited by examiner

*Primary Examiner*—Carl J. Arbes
(74) *Attorney, Agent, or Firm*—Bever, Hoffman & Harms, LLP; Patrick T. Bever

(57) ABSTRACT

Secure-digital (SD) type memory cards are produced using one or more prefabricated cover portions and a molded casing portion. A sub-assembly is formed by mounting a printed circuit board assembly (PCBA) onto the cover portion such that the contact pads of the PCBA are exposed through associated windows defined in the cover. The sub-assembly is placed into a cavity formed in a mold assembly, and molten thermoplastic material is then injected into each cavity of the mold assembly under heat and pressure using known injection molding techniques, thereby forming a molded plastic casing portion that secures the PCBA to the cover and completes the memory card housing.

16 Claims, 12 Drawing Sheets

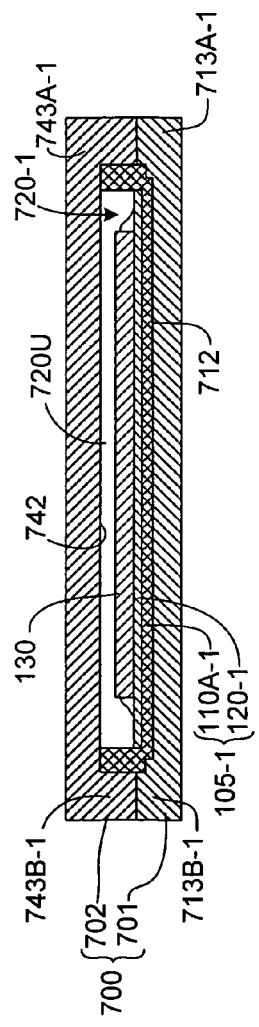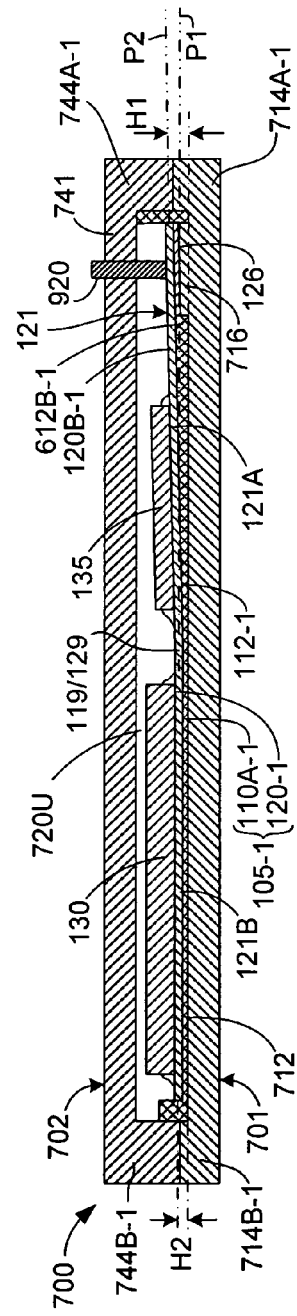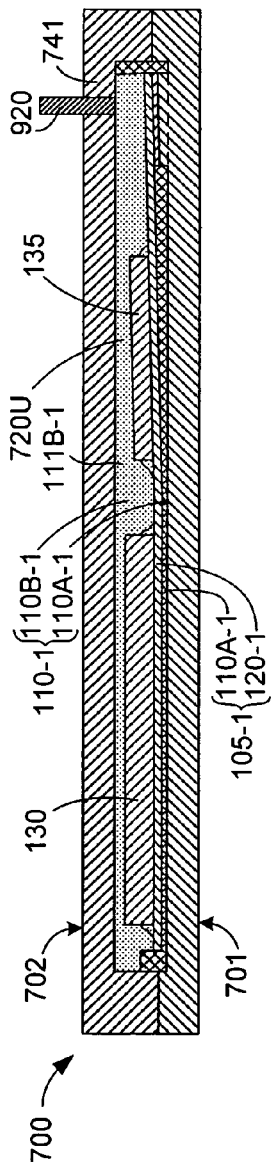

MEMORY CARD PRODUCTION USING PREFABRICATED COVER AND MOLDED CASING PORTION

BACKGROUND OF THE INVENTION

1. Field of the Invention

The invention relates to the field of electronic devices, and in particular, to a method and structure for accurately and neatly assembling a memory card-type electronic apparatus.

2. Related Art

Memory cards are widely used, for example, for storing digital pictures captured by digital cameras. One useful format is the Secure-Digital (SD) format, which is an extension of the earlier MultiMediaCard (MMC) format. These and other similar card-like structures are collectively referred to herein as "memory cards". Such memory cards are also useful as add-on memory cards for other devices, such as portable music players, digital still cameras (DSCs), personal digital assistants (PDAs), and even notebook computers. SD cards are hot-swappable, allowing the user to easily insert and remove SD cards without rebooting or cycling power. Since the SD cards are small, durable, and removable, data files can easily be transported among electronic devices by being copied to an SD card. SD cards are not limited to flash-memory cards, but other applications such as communications transceivers can be implemented as SD cards.

An important aspect of most memory card structures is that they meet size specifications for a given memory card type. In particular, the size of the casing or housing, and more particularly the width and thickness (height) of the casing/housing, must be precisely formed so that the memory card can be received within a corresponding slot (or other docking structure) formed on an associated card-hosting device. For example, using the SD card specifications mentioned above, each SD card must meet the specified 24 mm width and 2.1 mm thickness specifications in order to be usable in devices that support this SD card type. That is, if the width/thickness specifications of a memory card are too small or too large, then the card can either fail to make the necessary contact pad-to-card-hosting device connections, or fail to fit within the corresponding slot of the associated card-hosting device.

One conventional method for manufacturing memory cards that meet required size specifications includes using housing formed by two prefabricated covers that mounted over the PCBA. One shortcoming of this approach is that the covers are fabricated separately and then attached to the substrate using a relatively adhesive process that is tedious and subject to failure. That is, the fabrication of memory cards using glued-together covers increases production and assembly costs due to the small size of the areas subjected to the gluing (adhesive) process and extra fixtures or equipment needed to complete the process. In addition, there is always a void space formed underneath the plastic housing after the gluing process, creating a barrier for customer acceptance. Further, the adhesive is subject to failure, thereby causing the covers to become detached and exposing the PCBA to contamination or undesirable tampering.

What is needed is a card-type electronic apparatus housing and assembly method that enables high production throughput by way of cost-efficient molding techniques that avoid the problems associated with conventional production methods.

SUMMARY OF THE INVENTION

The present invention is directed to a method for manufacturing memory cards in which a sub-assembly including a printed circuit boards assembly (PCBA) and one or more prefabricated covers is subjected to a thermoplastic molding process to produce memory cards in a highly efficient and cost-effective manner. The sub-assembly is then formed by mounting the PCBA onto a first cover such that the contact pads of the PCBA are exposed through associated windows defined in the first cover. In one embodiment, the sub-assembly is then placed into a cavity of the molding apparatus with the upper surface of the PCBA exposed. In another embodiment, a second cover is placed over the PCBA before the molding process. Molten thermoplastic material is then injected into empty regions of the mold assembly cavity under heat and pressure using known injection molding techniques. The molten thermoplastic material enters open areas between the PCBA and the cover(s) to secure the PCBA to the cover(s) without the need for expensive and relatively unreliable manual adhesive processes. When only one prefabricated cover is used, the thermoplastic material also forms a molded casing portion that forms one wall of the memory card housing. Due to its reliable and durable connection between the cover(s) and the PCBA, the thermoplastic material prevents undesirable separation of the cover(s) from the PCBA, thereby preventing undesirable opening and/or disassembly of the memory card after production. The completed memory card is then removed from the mold assembly.

According to a specific embodiment, the present invention includes pre-fabricating several covers such that they are attached to a carrier strip by an associated plastic connecting segment to facilitate high volume production. Several sub-assemblies are then simultaneously formed by mounting a PCBA onto each cover. The sub-assemblies are then mounted onto a molding apparatus such that each sub-assembly is received in a corresponding cavity, and remain attached to the carrier strip by way of the connecting segments, which extend through grooves formed in the cavity walls. After the molding process, the completed memory cards are removed from the molding apparatus and singulated from the carrier strip.

According to another embodiment of the present invention, the method involves bending each PCBA inside the cover such that a rear section of the PCBA is maintained parallel with a lower surface of the associated cavity, and a front section of the PCBA is maintained at a slight angle relative to the rear section. This embodiment facilitates the production of SD-type memory cards using less expensive Thin Small Outline Package (TSOP)-type flash memory devices while maintaining the contact pads located at the front edge of the PCB at the 0.7 mm height required by SD specifications. Without such a bend, a more expensive Very Very Thin Small Outline Package (WSOP)-type of flash memory will have to be used.

According to another embodiment of the present invention, the method further involves attaching the movable portion of a switch onto a fixed portion (i.e., a rail or groove) that is formed along one side wall of the memory card housing (i.e., formed by portions of the cover(s) and/or portions of the molded casing portion).

According to yet another embodiment, the prefabricated cover includes an upper wall and a toe-like pocket formed by a portion of the upper wall and a first lower wall portion, with the contact pad windows being defined in the first lower wall portion. When the sub-assembly is formed, the front edge of PCBA is inserted into the pocket such that the contact pads are exposed through the upward facing windows, and the ICs face downward against the upper wall of the cover. A molded casing is then formed that includes a second lower wall portion formed on the exposed lower surface of the PCBA, thereby encasing the PCBA. In one embodiment, the molded casing is formed only on a side of the PCBA that does not include ICs, thereby protecting the ICs from excessive heat and pressure. In another embodiment, the molten plastic is injected on both sides of the PCBA.

According to another aspect of the invention, the disclosed method may be used to form memory cards meeting the SD memory card form factor, USB memory card form factors, and memory stick form factors.

The invention will be more fully understood in view of the following description of the exemplary embodiments and the drawings thereof.

BRIEF DESCRIPTION OF THE DRAWINGS

FIG. 8 is a cross-sectional end view showing a sub-assembly mounted inside of the mold assembly of FIG. 7(A);

FIGS. 9(A) and 9(B) are cross-sectional side views showing the sub-assembly of FIG. 8 during a molding process;

DETAILED DESCRIPTION

The present invention is directed to portable computer peripheral devices, and in particular to low-cost memory cards that are connected to host systems (e.g., digital cameras) to perform various functions. While the present invention is depicted in particular as a SD-type memory card and a USB memory device, it should be appreciated that the present invention is applicable to any and all similarly constructed memory devices. The term "host system" is used herein to refer to any electronic computer of any type or size including, but not limited to, desktop computers, notebook computers, palmtop computers, digital still cameras (DSCs) and personal digital assistant (PDAS) devices. Positional terms such as "front", "back", "upper", and "lower" are used for descriptive purposes in the description below and in the claims, and are intended only to describe relative positions of the recited parts, and are not intended to be limited to positions based on a fixed external reference.

Figure 1A:
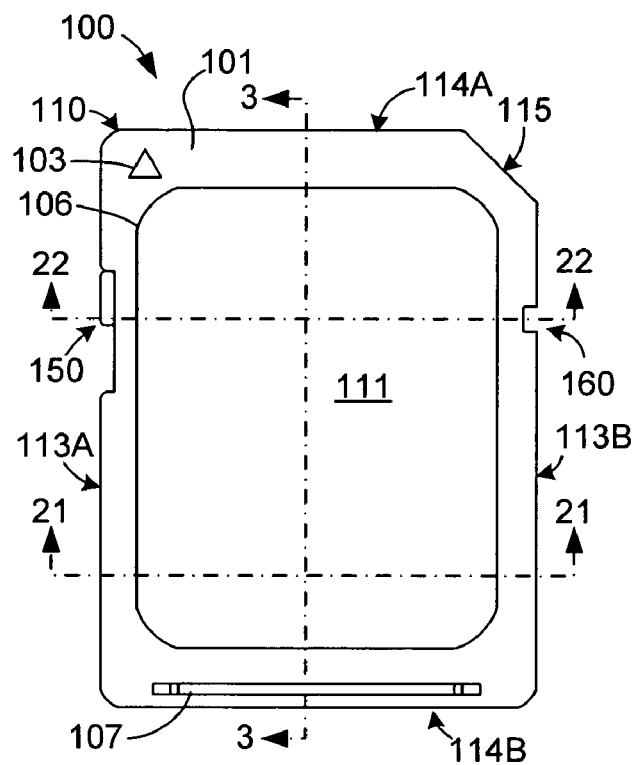
FIGS. 1(A), 1(B) and 1(C) are top, bottom, and side views of a memory card produced in accordance with an embodiment of the present invention.
Figure 1B:
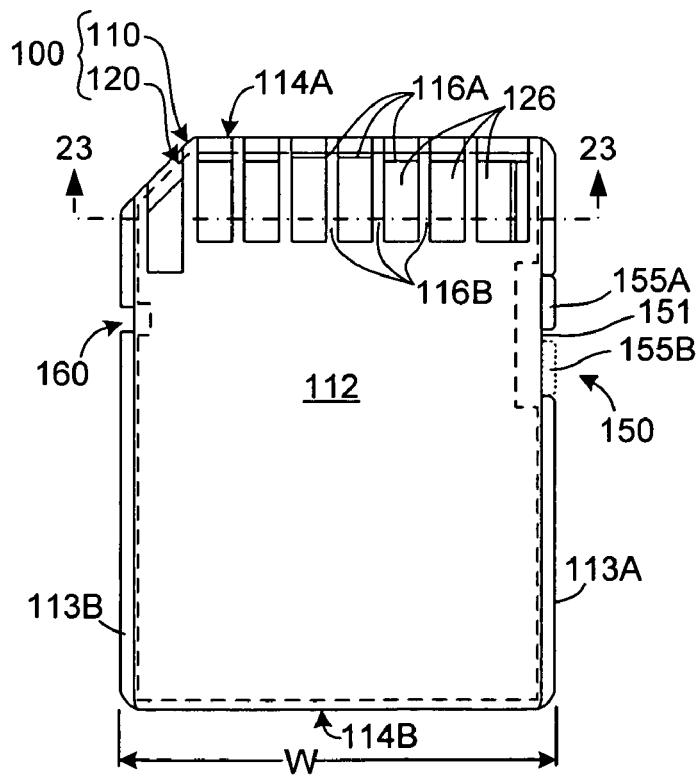
Figure 1C:
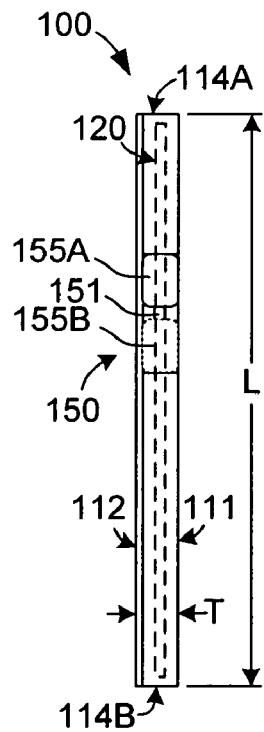

FIGS. 1(A), 1(B), and 1(C) are top, bottom, and side views, respectively, showing an exemplary SD-type memory card 100 constructed in accordance with an embodiment of the present invention. Memory card 100 is also shown in various cross-sectional views in FIGS. 2(A), 2(B), and 2(C).

Referring to FIG. 1(B), memory card 100 generally includes a plastic housing 110 and a printed circuit board assembly (PCBA) 120 (indicated by dashed line). Plastic housing 110 includes an upper wall 111 (FIG. 1(A)) and a lower wall 112 that are formed on respective upper and lower surfaces of PCBA 120 in the manner described below. Housing 110 also includes opposing side walls 113A and 113B, and opposing front and back walls 114A and 114B, respectively, that extend between upper wall 111 and lower wall 112 substantially around the entire periphery of housing 110. A chamfer 115 (FIG. 1(A)) is formed between front wall 114A and side wall 113B, and facilitates correct insertion of memory card 100 into a card-hosting device by preventing insertion with the lower side facing upward (i.e., the card-hosting device is constructed such that the full insertion of memory card 100 requires the proper orientation of chamfer 115). Lower wall 112 defines several windows 116A, which are separated by ribs 116B, which expose contact pads 126 of PCBA 120 in the manner described below. In the left upper corner (FIG. 1(A)), a triangular insertion direction mark 103 is provided for indicating the proper card insertion direction, and an optional identification label 106 is affixed in a central region of the upper surface. An optional feature 107 is provided adjacent to back wall 114B to facilitate manual insertion and removal of memory card 100 from a card-hosting device. Typically feature 107 is designed in the form of a long, narrow ditch or ridge.

As indicated in FIGS. 1(B) and 1(C), memory card 100 has a width W measured between side walls 113A and 113B of housing 110, a length L measured between front wall 114A and back wall 114B, and a thickness T measured between an uppermost surface of upper wall 111 and a lowermost surface of lower wall 112. Note that, of these specifications, the width W and the thickness T are the most critical, particularly adjacent to front wall 114A, because variance of the width and thickness may alter the position of the memory card in a card-hosting device, or prevent insertion altogether (i.e., if the width W and/or thickness T are too large, thereby preventing insertion of the memory card into a corresponding receiving slot provided on the card-hosting device).

Referring to FIGS. 1(A) through 1(C), according to an aspect of the present invention, memory card 100 also includes a write-protect switch structure 150 and a notch 160 exposed through openings defined on side walls 113A and 113B of housing 110, respectively. As indicated in FIGS. 1(B) and 1(C), switch structure 150 includes a base (fixed) portion 151 that is defined by a portion of housing 110 located on side wall 113A, and a movable portion 155 that is connected to base portion 151 such that movable portion 155 is selectively movable (e.g., slidable) between a first position (e.g., as indicated in solid lines by portion 155A) and a second position (e.g., as indicated in dashed lines by portion 155B). Switch structure 150 interacts with a host system to actuate (i.e., enable/disable) a write-protection system provided either on memory card 100 or the host system in response to the position of movable portion 155. For example, when movable portion 155 is in the first position 155A, the write-protection system is prevented from writing data onto memory card 100, and when movable portion 155 is in the second position 155B, the write-protection system is enabled to write data onto memory card 100 in accordance with operations of the host system according to known practices. Typically, the position of movable portion 155 is detected by the host system using a sensor according to known techniques, and the detected position is utilized by the host system to control the write-protection system. Switch structures are discussed in detail below.

Figure 2A:
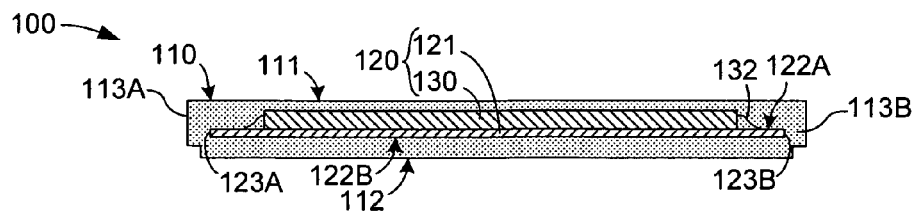
FIGS. 2(A), 2(B) and 2(C) are cross sectional views of the memory card of FIGS. 1(A)–1(C) taken along section lines 21—21, 22—22, and 23—23, respectively, of FIGS. 1(A) and 1(B)
Figure 2B:
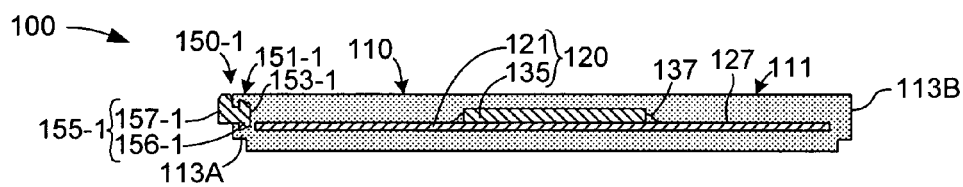
Figure 2C:
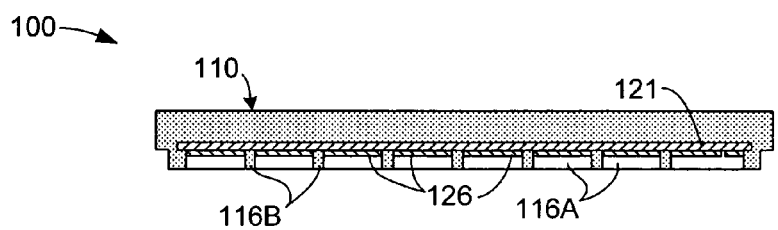

FIGS. 2(A), 2(B), and 2(C) are cross-sectional side views of memory card 100 taken along section lines 21—21, 22—22, 23—23 of FIGS. 1(A) and 1(B), respectively. FIG. 2(A) shows that PCBA 120 includes a printed circuit board (PCB) substrate 121 and a memory device 130 (e.g., a "Flash" memory chip) that is electrically connected to an upper surface 122A of substrate 121, e.g., by bonding wires 132. Upper wall 111 of housing 110 is formed over memory device 130 and upper surface 122A of substrate 121, and lower wall 112 is formed under a lower surface 122B of substrate 121. FIG. 2(B) indicates that PCBA 120 also includes a control circuit 135 that is electrically connected to substrate 121 by bonding wires 137, and is also covered by upper wall 111. Also mounted on substrate 121 are additional electronic components (e.g., capacitors, resisters, and other integrated circuits), which are omitted for illustrative purposes. Finally, FIG. 2(C) shows a cross section taken near the front wall of housing 110 and passing through contact pads 126, and shows ribs 116B separating windows 116A, which expose contact pads 126.

Referring to the left side of FIG. 2(B), a switch structure 150-1, which represents a first specific embodiment of switch structure 150 mentioned above, is shown in additional detail. Switch structure 150-1 includes a base portion 151-1 that is formed by a portion of side wall 113A, and a movable portion 155-1 that is slidably connected to base portion 151-1. In particular, base portion 151-1 defines an elongated channel 153-1 that receives a rail 156-1 formed on movable portion 155-1 such that rail 156-1 is slidably received in channel 153-1. Movable portion 155-1 also includes a handle portion 157-1 that is fixedly connected to rail 156-1 and disposed for manual manipulation.

Figure 3A:
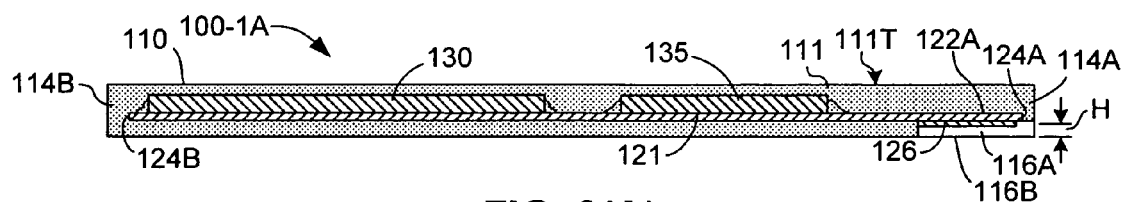
FIGS. 3(A) and 3(B) are cross-sectional views taken along section line 3—3 of FIG. 1(A) showing memory cards produced in accordance with alternative embodiments of the present invention.
Figure 3B:
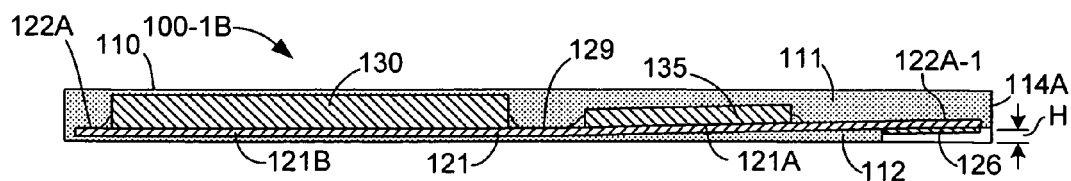

FIGS. 3(A) and 3(B) illustrate alternative cross-sectional views taken along section line 3—3 of FIG. 1(B) (i.e., showing the entire length between front wall 114A and rear wall 114B, which extend over front edge 124A and rear edge 124B of substrate 121). FIG. 3(A) shows a first memory card 100-1A formed in accordance with the first manufacturing method (described below) in which substrate 121 is substantially planar (i.e., such that a distance between upper surface 122A of substrate 121 and an uppermost surface 111T of upper wall 111 is substantially uniform along the entire length of substrate 121). Note that substrate 121 is maintained within housing 110 such that the thickness of lower wall 112 is uniform along the entire length, and contact pads 126 (exposed through windows 116A) are maintained at a specified height H of 0.7 mm from a bottom edge of ribs 116B. Alternatively, FIG. 3(B) illustrates a second memory card 100-1B formed in accordance with the second manufacturing method (described below) in which substrate 121 is bent at a seam 129 such that a rear section 121B located under memory device 130 is substantially planar, as described above, but a front section 121A of substrate 121 is angled slightly upward (i.e., such that a height from upper wall 111 to upper surface of substrate 120 in the portion located over controller device 135 on front section 121A decreases gradually toward front wall 114A, and a height from lower wall 112 to lower surface of substrate 121 in the portion located under front section 121A increases gradually toward front wall 114A). Note that the location of seam 129 and the inclination angle of front section 121A are selected such that contact pads 126 are located at the specified height H. The bent-substrate embodiment arrangement shown in FIG. 3(B) is beneficial because it facilitates the fabrication of SD-type memory cards using inexpensive TSOP memory devices, as explained in further detail below.

Figure 4:
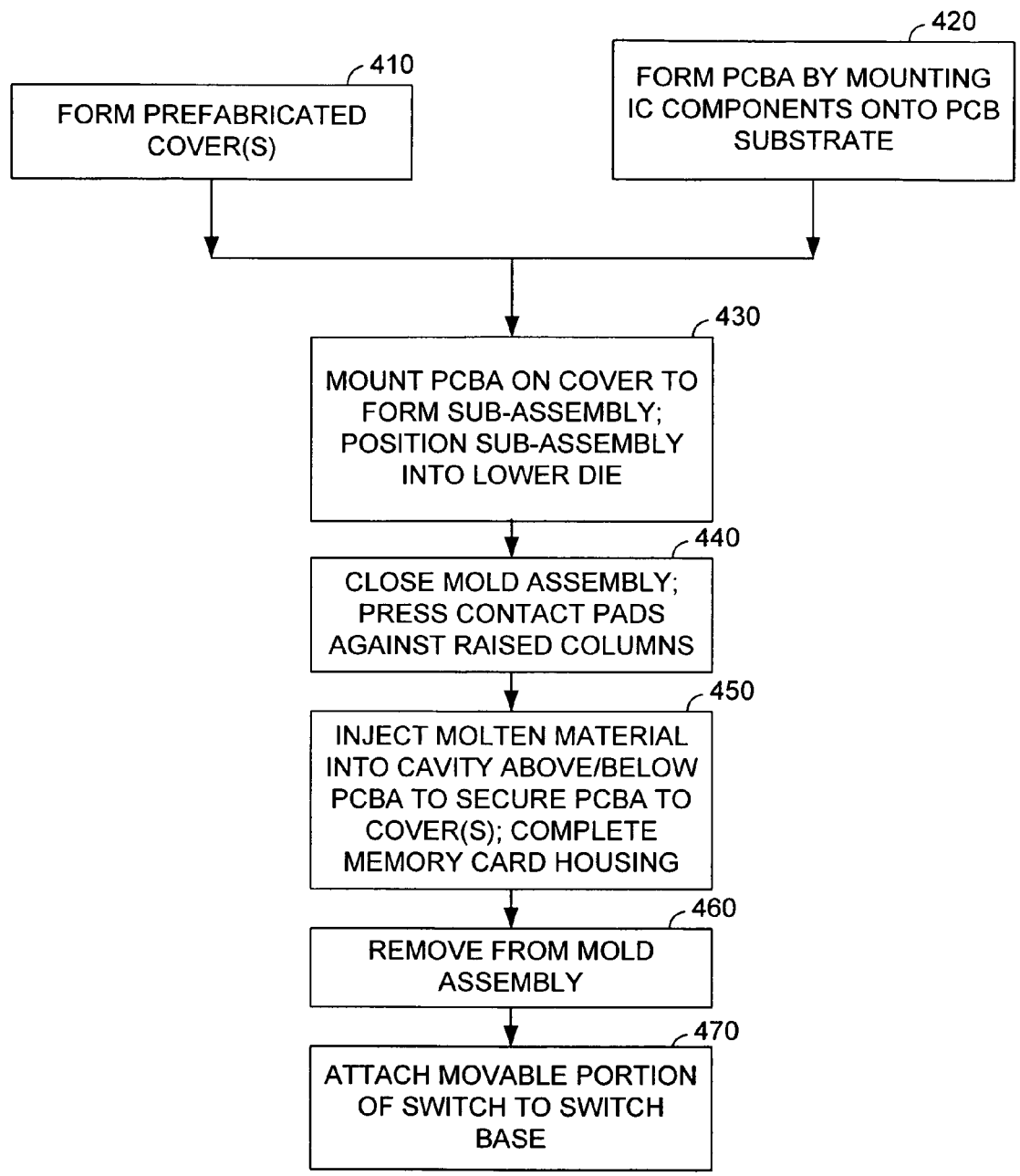
FIG. 4 is a flow diagram showing a memory card manufacturing method according to an embodiment of the present invention.

FIG. 4 is a flow diagram depicting a memory card manufacturing method according to a generalized embodiment of the present invention. Referring to the upper portion of FIG. 4, the manufacturing process begins by forming at least one prefabricated cover (block 410) and forming a PCBA (420). According to a first aspect of the present invention, at least a portion of housing 110 including one of upper wall 111 and lower wall 112 (see FIGS. 1(C)) are formed by the prefabricated cover, and at least a portion of the cover defines the contact pad window 116A (see FIG. 1(B)). As mentioned above, PCBA 120 includes a substrate having contact pads 126 (FIG. 1(B)) formed along its front edge. Returning to FIG. 4, the PCBA is mounted onto the cover to form a sub-assembly, and the sub-assembly is placed into the lower die of a molding apparatus (block 430). In alternative embodiments, the cover can be mounted on the lower die and then the PCBA mounted thereon to form the sub-assembly, or the completed sub-assembly can be mounted onto the lower die. The mold assembly is then closed such that the cover and PCBA are enclosed in a mold cavity, and such that raised columns are pressed against the contact pads of the PCBA to prevent plastic from being formed on the contact pads (block 440). Molten thermoplastic material is then injected into the mold cavity such that the thermoplastic material secures the PCBA to the cover(s) (block 450). As discussed with reference to the specific embodiments provided below, the molded thermoplastic material also forms at least a portion of upper wall 111 and/or a portion of lower wall 112 that completes the formation of housing 110 (FIG. 1(C)), thus completing the memory card. The completed memory card is then removed from the molding apparatus (block 460), and the movable portion of the write-protect switch, when provided, is attached (block 470).

Figure 18:
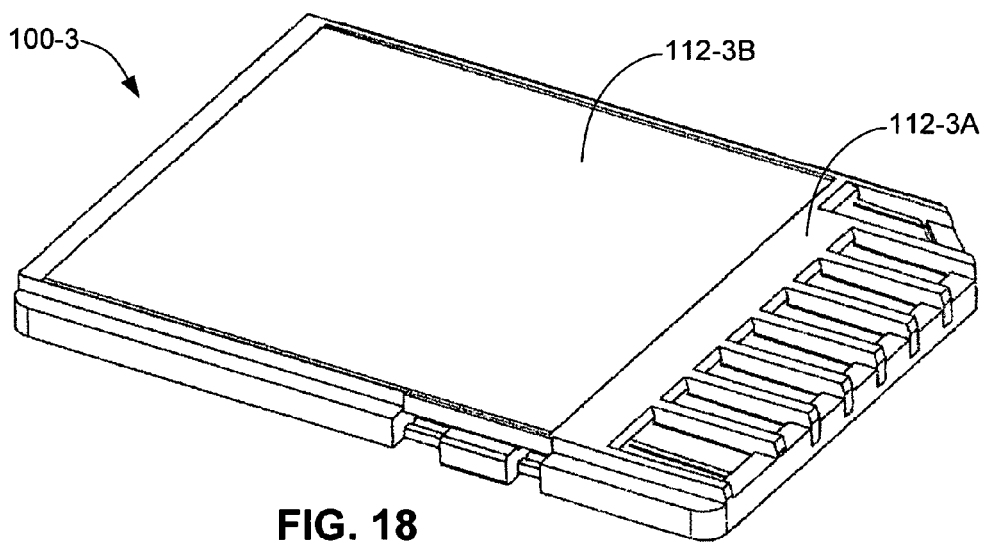
FIG. 18 is a perspective view showing a memory card produced during the molding processes of FIGS. 17(B) or 17(C)
Figure 19:
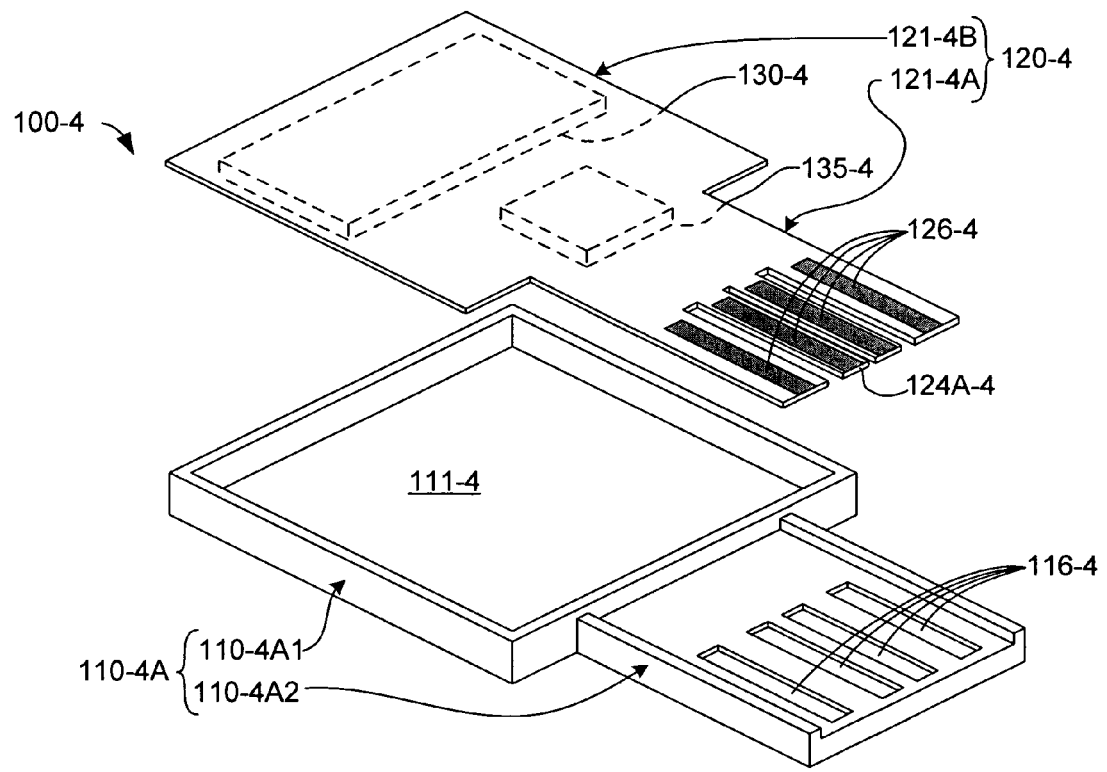
FIG. 19 is an exploded perspective view showing a cover and PCBA utilized to form a USB memory device according to another embodiment of the present invention.
Figure 20:
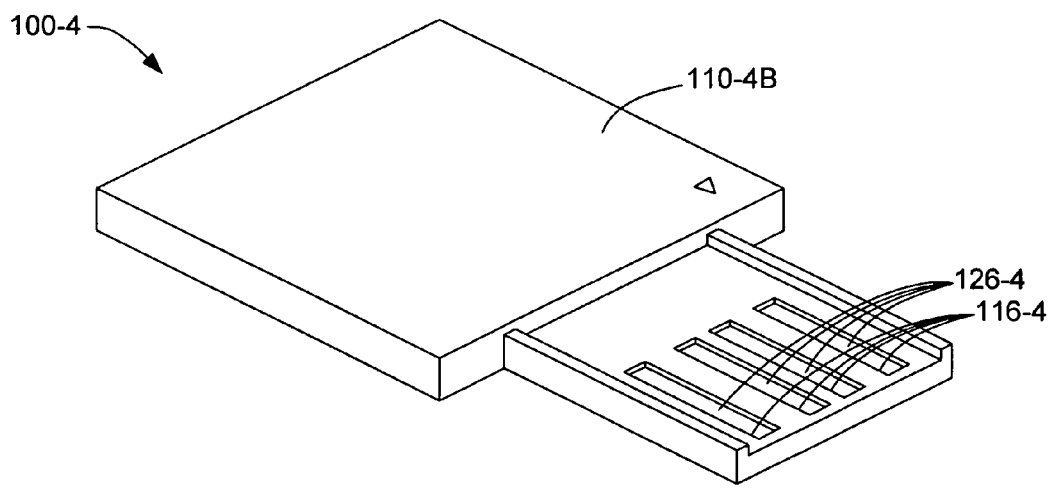
FIG. 20 is a perspective view showing a completed USB memory device including the cover and PCBA of FIG. 19.

The basic method described with reference to FIG. 4 will now be described in additional detail with reference to several specific embodiments. FIGS. 5(A) through 12 depict a first specific embodiment involving the formation of SD-type memory cards. FIGS. 13(A) through 16 depict a second specific embodiment involving a different SD-type memory card. FIGS. 17(A) to 18(B) depict a third specific embodiment involving yet another SD-type memory card. FIGS. 19 and 20 depict a fourth specific embodiment involving a universal serial bus (USB) memory device.

Figure 5A:
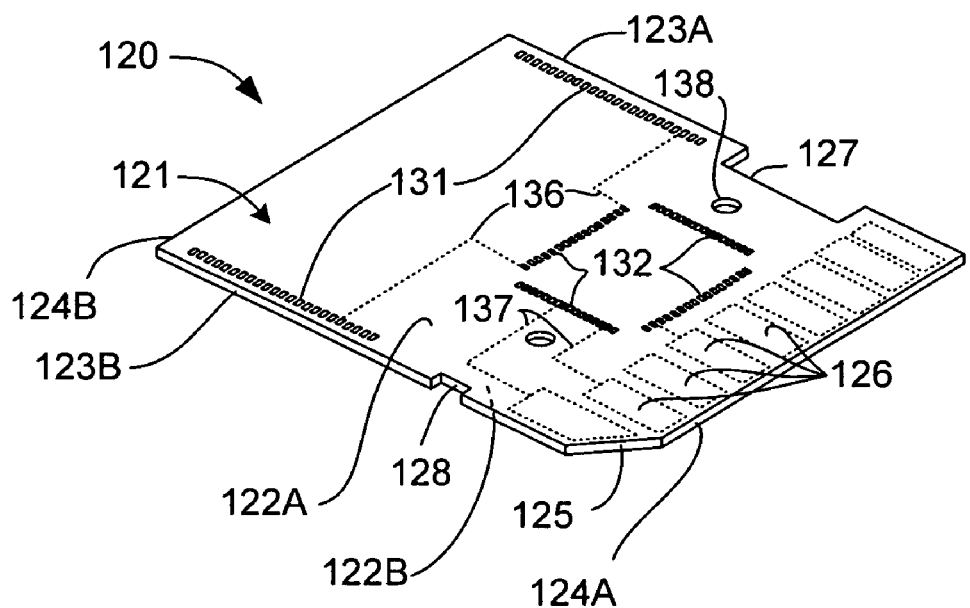
FIGS. 5(A) and 5(B) are perspective views showing a PCBA utilized in the production of memory cards according to an embodiment of the present invention.
Figure 5B:
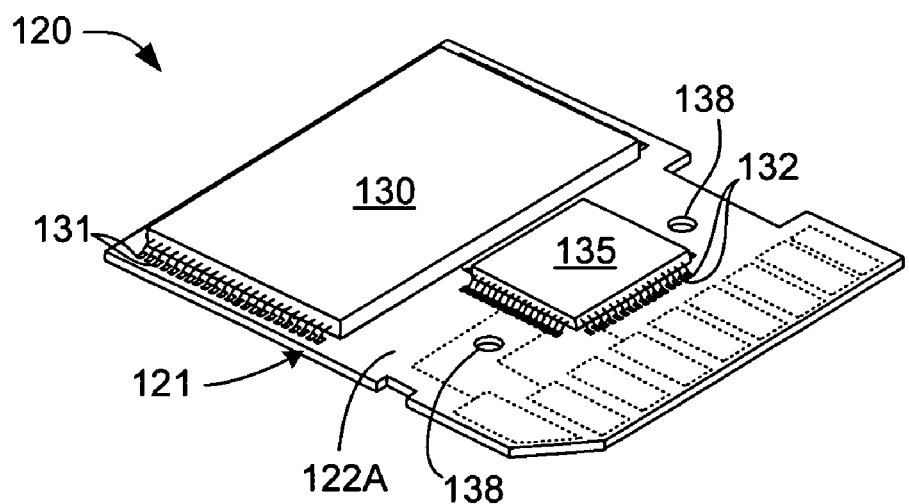

FIGS. 5(A) and 5(B) are top and partial perspective views showing an exemplary PCBA 120 utilized in the first specific embodiment of the present invention. Similar PCBAs are utilized in the second and third embodiments as well.

FIG. 5(A) shows a PCB substrate 121 of PCBA 120 by itself. PCB substrate 121 includes an upper surface 122A, a lower surface 122B, a front edge 124A, an opposing back edge 124B, and opposing first and second side edges 123A and 123B. A chamfer 125 is provided between front edge 124A and side edge 123B. Located on lower surface 122B adjacent to front edge 124A are nine metal contact pads 126 (shown in dashed lines). Side edge 123A defines a "switch" notch 127 that facilitates the formation of an optional switch structure, discussed in further detail below. Side edge 123B defines an "indicator" notch 128 that facilitates the engagement with sensing mechanisms located inside the slot when the flash memory card is properly inserted into the host device. Substrate 121 is formed from multiple layers or an electrically insulating material, such as bismalemide-triazine, epoxy resins, or polyamide resins, and copper traces extending between the layers according to known PCB fabrication techniques to provide predetermined electrical connections. For example, as indicated in FIG. 5(B), substrate 121 includes a first exposed contact pattern 131 and a second contact pattern 132 are provided on upper surface 122A, with selected pads of contact pattern 131 connected to corresponding pads of contact pattern 132 by buried conductors 136 (two shown in FIG. 5(A)), and selected pads of contact pattern 132 connected to corresponding metal contact pads 126 by buried conductors 137 (two shown in FIG. 5(A)). Those skilled in the art will recognize that only a few conductors are indicated for illustrative purposes, and that the pattern positions and arrangements may be selectively altered. Optional through holes 138 are defined through PCB substrate 121 to facilitate alignment and the flow of plastic material during the molding process described below. Note that the number of layers and the thickness of each layer are also selected based on predetermined dimensions. For example, in the exemplary embodiment described herein, total substrate thickness is approximately 0.2 to 0.3 mm thick.

Referring to FIG. 5(B), PCBA 120 also includes various electrical components (e.g., memory device 130, control circuit 135, capacitors, resisters and other IC devices) that are mounted onto upper surface 122A of substrate 121, typically using an automated assembly machine. This mounting process involves passing substrate 121 through a solder dispensing machine (not shown) such that the solder paste is dispensed onto each pad of contact patterns 131 and 132 using known techniques. Next, substrate 121 is sent to an assembly machine (not shown) that utilizes holes 138 or other markings to facilitate indexing (alignment) of the substrate regions into the designated location inside the assembly machine. Next, the electrical components are mounted onto the solder-pasted regions of substrate 121, and the assembled substrate is passed through an oven (not shown) to reflow the solder paste according to known techniques such that each component is soldered to substrate 121, thereby completing the production of PCBA 120.

Before further processing, each PCBA 120 may be subjected to an optional intermediate programming and test procedure. In one embodiment, this program/test procedure involves contacting probes to predetermined regions of each substrate region to power up and detect each memory card device, and then programming the detected memory card circuit, for example, by writing test data into the memory device. The programmed memory card circuit is then tested, for example, by reading the previously stored data and comparing with known good data. In one alternative embodiment, the tested memory card circuit is formatted, for example, by writing all binary "0" values into the memory device, and/or subjected to an identification writing process in which identification information is written into special memory locations of the memory card circuit.

Figure 6A:
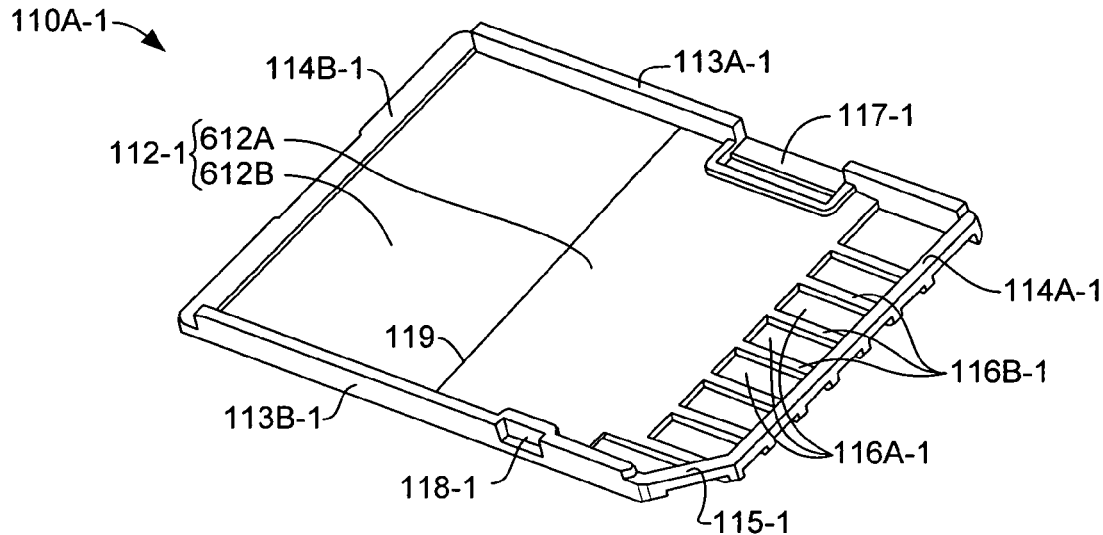
FIGS. 6(A) and 6(B) are perspective views showing a cover and cover carrier, respectively, utilized in the production of memory cards according to an embodiment of the present invention.

FIG. 6(A) is a perspective view showing a prefabricated cover 110A-1 formed in accordance with the first specific embodiment. In this embodiment, prefabricated cover 110A-1 forms a lower portion of the overall memory card housing. In particular, cover 110A includes a lower wall 112-1 that defines windows 116A-1, which are separated by ribs 116B-1. A front wall portion 114A-1, a rear wall portion 114B-1, side wall portions 113A-1 and 113B-1, and a chamfer wall 115-1 extend upward from lower wall 112-1. Side walls 113A-1 and 113B-1 respectively include a switch notch structure 117-1 and an indicator notch structure 118-1. Lower wall 112-1 includes a front section 612A and a rear section 612B that are separated by an optional seam line 119. In one embodiment, front section 612A and rear section 612B are coplanar, and lower wall is consistent with the structure shown in FIG. 3(A) (discussed above). In another embodiment, rear section 612B is horizontal, and front section 612A, which begins at seam 119, extends at an acute angle to rear section 612B in a manner consistent with the structure shown in FIG. 3(B) (also discussed above).

Figure 6B:
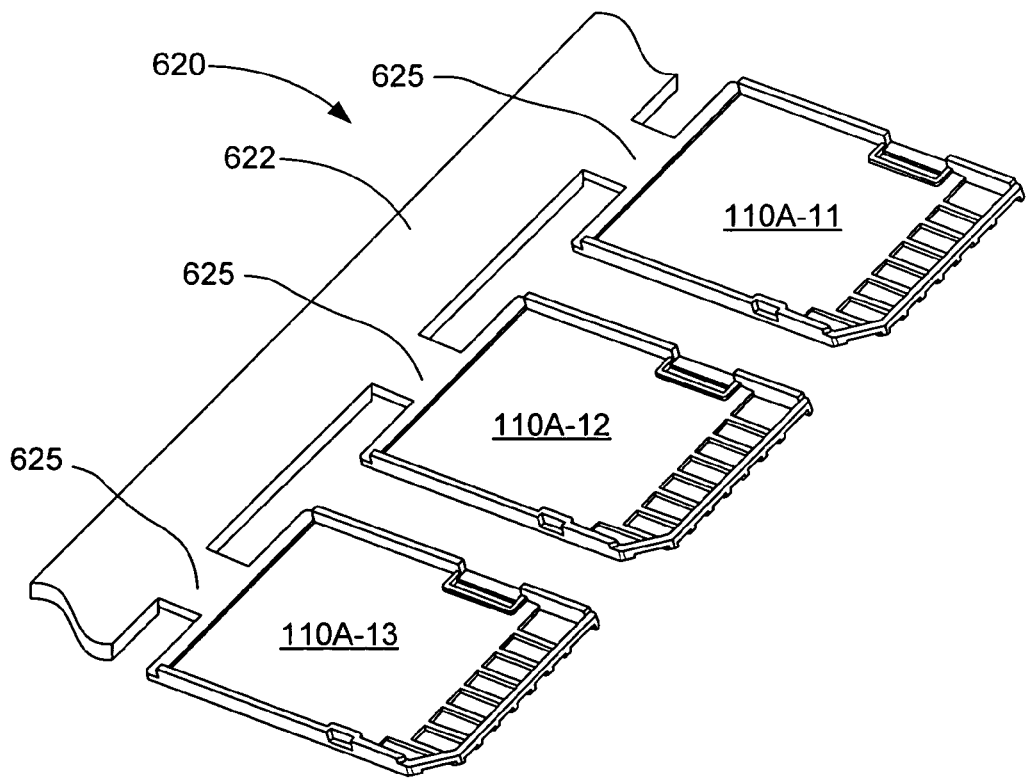

FIG. 6(B) shows a carrier assembly 620 including several prefabricated covers 110A-11 through 110A-13 that are attached to a carrier strip 622 by associated connecting segments 625 according to an alternative embodiment of the present invention. Each cover 110A-11 through 110A-13 is substantially identical, and the same as cover 110A-1 of FIG. 6(A)). Prefabricated covers 110A-11 through 110A-13 and carrier strip 622 are simultaneously formed during a single molding process, and in one embodiment carrier assembly 620 is maintained as a single unit during subsequent molding process that completes the memory card housings. Alternatively, covers 110A-11 through 110A-13 may be separated prior to the molding process.

Figure 7A:
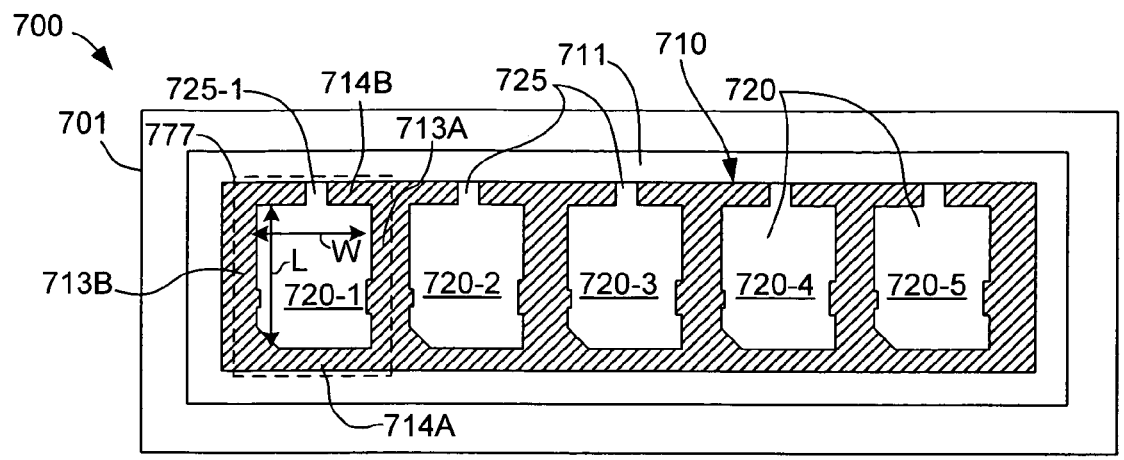
FIGS. 7(A) and 7(B) are top and partial perspective views depicting a portion of a mold assembly utilized in the production of memory cards according to an embodiment of the present invention.
Figure 7B:
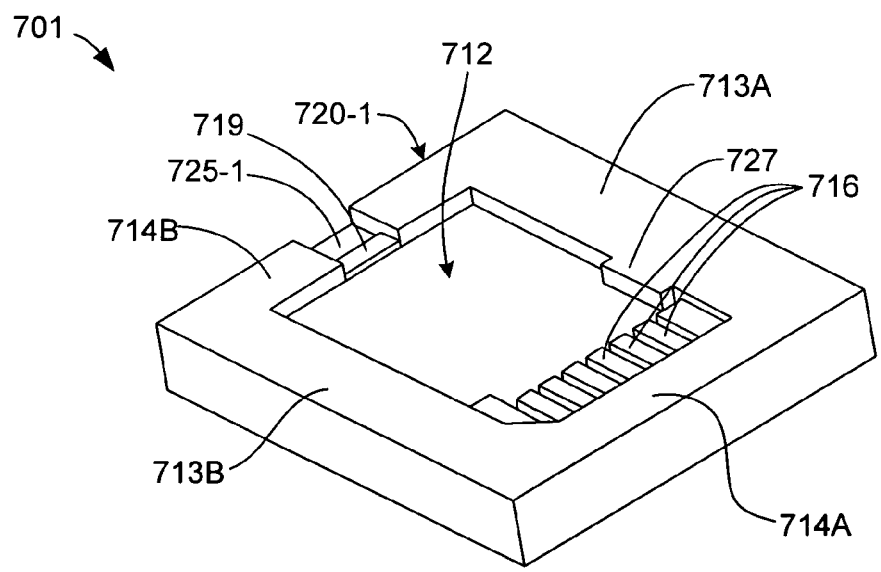

FIGS. 7(A) and 7(B) are top and partial perspective views showing the lower portion (die) 701 of an exemplary mold assembly 700 produced in accordance with an embodiment of the present invention. In FIG. 7(A), shaded regions denote a substantially planar upper surface of the die, and intervening non-shaded regions denote recessed surfaces. Lower portion 701 includes a peripheral land 711 surrounding a row of cavities 720 (e.g., cavities 720-1 through 720-5) that are defined by a raised wall structure 710. Peripheral land 711 may include indexing pin (not shown) that can be used to properly position carrier assembly 620 (FIG. 6(B)) when mounted thereon, as discussed below.

The raised wall structure surrounding each cavity defines inside surfaces that are substantially equal to or slightly larger than prefabricated covers 110A-1. Specifically, the width W defined by side walls 713A and 713B, which define the side edges of cavity 720-1, is equal to the width dimension of cover 110A-1. Similarly, the length L separating the inside surfaces of front wall 714A and rear wall 714B, which define the front and rear edges of cavity 720-1, is equal to the specified length dimension of the desired memory card.

According to an aspect of the present invention, each wall of each cavity 720 communicates by way of a groove 725 to peripheral land 711. For example, as indicated in FIG. 7(A), rear wall 714A of cavity 720-1 communicates with the uppermost portion of land 711 by a groove 725-1. Note that grooves 725 are sized to receive connector strips 625 when carrier assembly 620 (discussed above) is mounted onto lower portion 701.

FIG. 7(B) shows a section 777 (indicated by dashed-line square in FIG. 7(A)) of lower portion 701 in additional detail. This section includes cavity 720-1, which is defined by a lower cavity surface 712, a front wall 714A, an opposing back wall 714B, and opposing first and second side walls 713A and 713B. An angled chamfer wall portion extends between front wall 714A and side wall 713B. Located on lower cavity surface 712 adjacent to front wall 714A are nine raised (platform-like) columns 716 that correspond with contact pads 126 of PCB substrate 121 (discussed above). These raised columns will be pinched against the contact pads as the PCBA is positioned in the cavity (discussed later), and prevent thermoplastic from molding over the contact pads. Side wall 713A defines a switch feature 727 that corresponds to switch notch structure 117-1 of cover 110A-1. Similarly, side wall 713B includes a feature (not shown) that corresponds to indicator notch 118-1.

According to another aspect of the present invention, each groove 725 formed in rear wall 714B surrounding each cavity includes a raised tip 719 that is used to pinch a corresponding connecting segment during the molding process. For example, as best shown in FIG. 7(B), a raised tip 719 is formed at the inside edge of groove 725-1. A corresponding tip (not shown) formed on the upper die of the mold assembly 700 presses on the upper surface of a connecting segment (not shown) placed in groove 725-1 such that the connecting segment is pinched between the two tips. Note that FIG. 7(B) is for illustration purpose, and thus other mold features such as water cooling or air venting channels that are not necessary to explain the invention were not shown.

FIG. 8 is a cross-sectional end view showing a portion of upper portion 702 of mold assembly 700 mounted onto lower portion 701 to enclose a sub-assembly 105-1 formed by cover 110A-1 and PCBA 120-1 is enclosed within cavity 720-1. In particular, side walls 743A-1 and 743B-1 respectively mate with side walls 713A-1 and 713B-1 of lower portion 701, and an upper cavity surface 742 of upper portion 702 is spaced from lower cavity surface 712 of lower portion 701 by a thickness of the desired memory card housing. Cover 110A-1 is received inside cavity 720-1 such that a lower surface of lower wall 112-1 rests against lower cavity surface 712, and an empty upper cavity space 720U is defined between an upper surface of memory device 130 and an upper cavity surface 742 of upper portion 702. As described below, this cavity region is filled by molten plastic in the subsequent molding process to form the upper wall of the memory card housing.

FIGS. 9(A) and 9(B) are cross-sectional side views respectively showing mold assembly 700 before and after the molding process that forms the upper portion of the memory card housing. FIG. 9(A) shows mold assembly 700 front wall 744A-1 and rear wall 744B-1 of upper portion 702 respectively mate with front walls 714A-1 and rear wall 714B-1 of lower portion 701, and upper cavity space 720U extends over both memory device 130 and control device 135. Note that PCB substrate 121 is mounted in a bent arrangement on cover 110A-1 such that a rear section 121B of PCB substrate 121 defines a first plane P1, and such that a front section 121A of PCB substrate 121 defines a second plane P2 that extends at an acute angle relative to plane P1. As indicated, this bent/angled orientation is achieved by maintaining rear section 121B at a first height H1 relative to lower cavity surface 712 (i.e., relative to a lower surface of lower wall 112-1), providing bend 129 at seam 119, and maintaining front section 121A at an inclined angle such that contact pads 126 are maintained at a second height H2 relative to lower cavity surface 712. By providing a bend (seam) 129 in PCB 121 at a selected location, the bent orientation shown in FIG. 9(A) can be reliably and repeatedly achieved. That is, the thin PCB material (about 0.3 mm in thickness) is flexible, and thus can accept a slight bending in unpopulated regions where no electronic component exists. This arrangement allows a less expensive Thin Small Outline Package (TSOP)-type of flash memory chip (1.1 mm in thickness) to be used while maintaining the front end of the PCB to be slightly tilted downward (away from ribs) to allow the PCB to be placed underneath the rib and maintain a 0.7 mm distance to the top surface as defined by the SD specifications. Without such a bend, a more expensive Very Very Thin Small Outline Package (WSOP)-type of flash memory will have to be used.

As indicated in FIG. 9(B), after sub-assembly 105-1 is positioned inside of mold assembly 700, molten molding material is injected into open cavity region 720U under heat and pressure using known injection molding techniques to form molded casing 110B-1, which combined with cover 110A-1 to complete housing 110-1. In particular, molded casing 110B-1 covers memory device 130, control device 135, and all exposed portions of PCBA 120, thereby securing PCBA to cover 110A-1, and also forms upper wall 112-1 of housing 110-1. Note that one or more mechanisms may be utilized to secure each PCBA inside its associated cover to prevent shifting (displacement) of the PCBA before or during the molding process. For example, referring to the upper right portion of FIG. 9(A), a retractable plate or rod 920, which extends through upper wall 741 of mold assembly 700, may be utilized to press contact pads 126 against raised columns 716 before and at the beginning of the molding process, and withdrawing plate/rod 920 during the injection process prior to the moving front of the molten plastic reaches the plate or rod position (as indicated in FIG. 9(B)) such that the molten thermoplastic material forms the required molded casing. After an appropriate cooling down period, the substantially completed memory cards are removed from mold assembly 700, and then the individual memory cards are singulated (i.e., when optional carrier assembly 620 is used).

Figure 10:
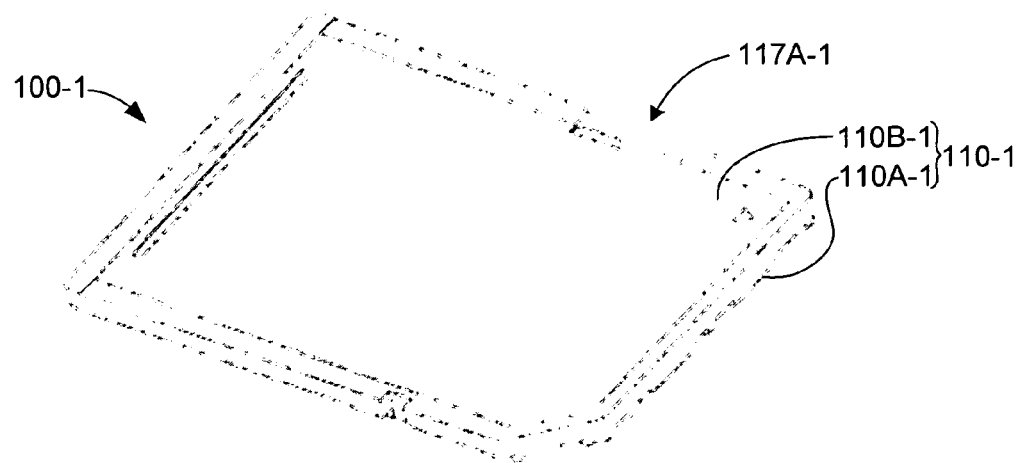
FIG. 10 is a perspective bottom view depicting a substantially completed memory card after being removed from the mold assembly of FIG. 9(B)

FIG. 10 show an exemplary, nearly completed memory card 100-1 upon removal from the mold assembly and after subsequent singulation (when needed). As indicated, molded casing 110B-1 forms an upper housing portion of housing 110-1, with cover 110A-1 forming the lower portion. The only portion missing from memory card 100-1 at this point is the completion of optional write-protect switch, which is mounted into switch notch 117A-1.

Figure 11:
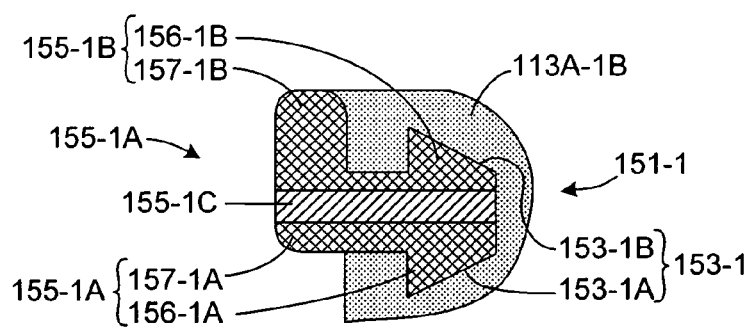
FIG. 11 is a cross-sectional side view showing a switch structure according to an alternative embodiment of the present invention.

FIG. 11 shows the mold construction to accommodate an insertion-type write-protect switch structure when the fixed portion is formed by the molded casing (as opposed to being formed on the prefabricated cover), along with a corresponding portion of a cavity to be filled by the thermoplastic to form a side wall 113A-1B of the molded casing. This arrangement will produce a cavity after molding to receive the switch structure according to an embodiment of the present invention. The switch structure generally includes a base (fixed) portion 151-1 embodied by an elongated channel 153-1 defined in molded side wall 113A-1B. Base portion 151-1 is formed during the molding process by an insert 155-1 that is engaged within the mold in the assembled state depicted in FIG. 11. Channel 153-1 includes a lower channel portion 153-1A and an upper channel portion 153-1B. Insert 155-1 includes a lower member 155-1A, an upper member 155-1B, and a shim 155-1C. Lower member 155-1A includes a lower rail portion 156-1A and a lower handle portion 157-1A, and upper member 155-1B includes an upper rail portion 156-1B and an upper handle portion 157-1B. After molding, a cavity excavated by the insert 155-1 is formed in the mold assembly and the three insert pieces 155-1A, 155-1B and 155-1C are removed. The shim 155-1C is removed first, creating a space between lower member 155-1A and upper member 155-1B. One of the upper/lower members is removed from the cavity next. Note that some rotation of the member inside the cavity is needed in order to remove the member. The remaining upper/lower member is finally removed from the cavity. A separately molded switch having a shape of the combined external of members 155-1A, 155-1B and 155-1C is then inserted into the just emptied cavity.

Figure 12:
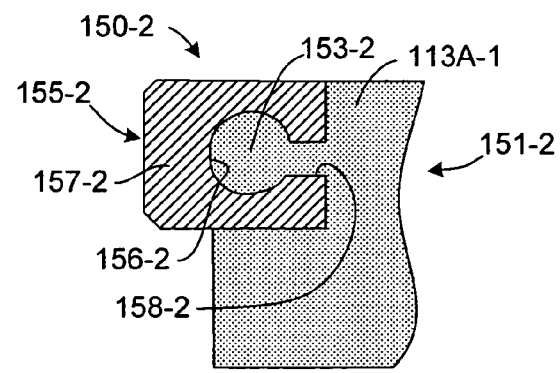
FIG. 12 is a top view showing a substrate carrier utilized in the production of memory cards according to an alternative embodiment of the present invention.

FIG. 12 shows a mounting-type write-protect switch structure 150-2 that is mounted onto a side wall 113A-1 that is formed either by the molded casing or the prefabricated cover according to another embodiment of the present invention. Switch 150-2 generally includes a base (fixed) portion 151-2 embodied by an elongated rail 153-2 defined by a portion of side wall 113A-1, and a movable portion 155-2 that defines an elongated opening 156-2 and has a handle portion 157-2 that extends from side wall 113A-1. An opening 158-2 is defined along elongated opening 156-2 to facilitate snap-coupling movable portion 155-2 onto fixed portion 151-2 such that movable portion 155-2 is slidably engaged on elongated rail 153-2.

Figure 13:
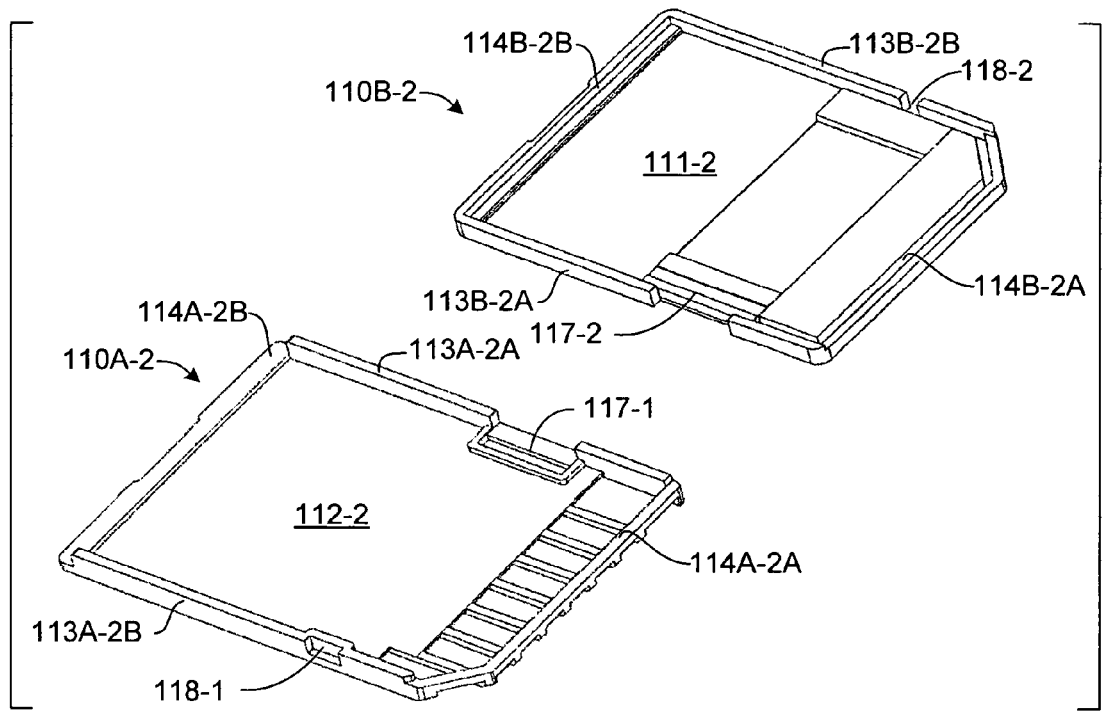
FIG. 13 is an exploded perspective view showing corresponding top and bottom covers, respectively, according to another embodiment of the present invention.

FIG. 13 is an exploded perspective view showing a prefabricated lower cover 110A-2 and a prefabricated upper cover 110B-2 according to another embodiment of the present invention. Lower cover 110A-2 is essentially identical to prefabricated cover 110A-1 (discussed above), and is constructed to receive a PCBA in the manner described above. In particular, lower cover 110A-2 includes a bottom wall 112-2, front wall 114A-2A, back wall 114A-2B, and side walls 113A-2A and 113A-2B, with side walls 113A-2A and 113A-2B defining a first switch notch portion 117-1 and a first indicator notch portion 118-1. Upper cover 110B-2 is formed in a complementary manner to lower cover 110A-2, and includes an upper wall 111-2, front wall 114B-2A, back wall 114B-2B, and side walls 113B-2A and 113B-2B, with side walls 113B-2A and 113B-2B defining a second switch notch portion 117-2 and a second indicator notch portion 118-2.

Figure 14A:
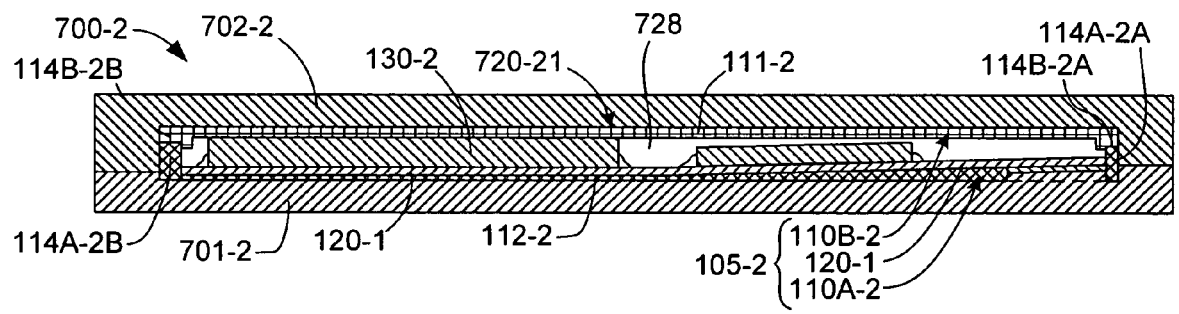
FIGS. 14(A) and 14(B) are cross-sectional side views depicting a molding process involving the top and bottom covers of FIG. 13.

FIG. 14(A) shows a sub-assembly 105-2 located inside of a chamber 720-21 of a molding assembly 700-2, which is formed by a lower die 701-2 and an upper die 702-2 in a manner similar to that describe above. As indicated at the lower portion of FIG. 14(A), sub-assembly 105-2 includes lower cover 110A-2 and PCBA 120-1 assembled as described above, and also includes upper cover 110B-2 mounted onto lower cover 110A-2 such that PCBA 120-1 is maintained in a space 728 between upper wall 111-2 and lower wall 112-2. In one embodiment, mounting upper cover 110B-2 onto lower cover 110A-2 involves mounting front wall 114B-2A of upper cover 110B-2 onto front wall 114A-2A of lower cover 110A-2, and mounting rear wall 114B-2B of upper cover 110B-2 onto rear wall 114A-2B of lower cover 110A-2. In a similar fashion, side walls 113B-2A and 113B-2B of upper cover 110B-2 are mounted onto side walls 113A-2A and 113A-2B of lower cover 110A-2, switch notch portions 117-1 and 117-2 combine to form a fixed switch assembly, and indicator notch portions 118-1 and 118-2 combine to form an indicator structure.

Figure 14B:
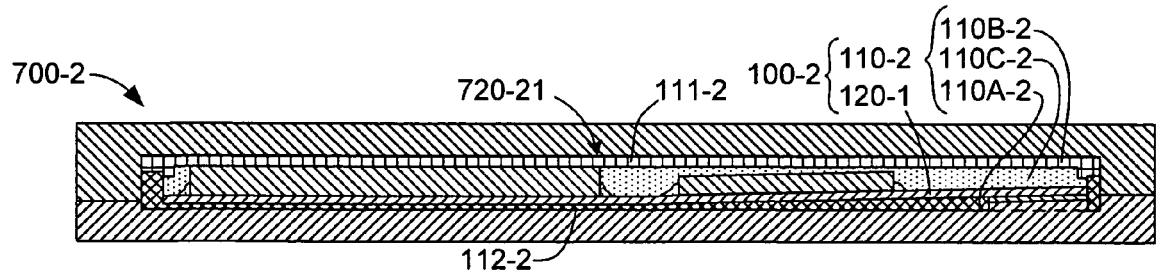

FIG. 14(B) shows a substantially completed memory card 100-2 located inside of mold assembly 700-2 after molten thermoplastic material is injected into cavity 720-21, and in particular into the space between upper wall 111-2 and lower wall 112-2, to form an intermediate casing portion 110C-2. In particular, memory card 100-2 includes PCBA 120-1 and a housing 110-2, which is formed by lower cover 110A-2, upper cover 110B-2, and intermediate casing portion 110C-2. Note that in addition to securing PCBA 120-1 to lower cover 110A-2 and upper cover 110B-2, intermediate casing portion 110C-2 also makes housing 110-2 substantially more stable by providing a solid support between upper wall 111-2 and lower wall 112-2.

Figure 15:
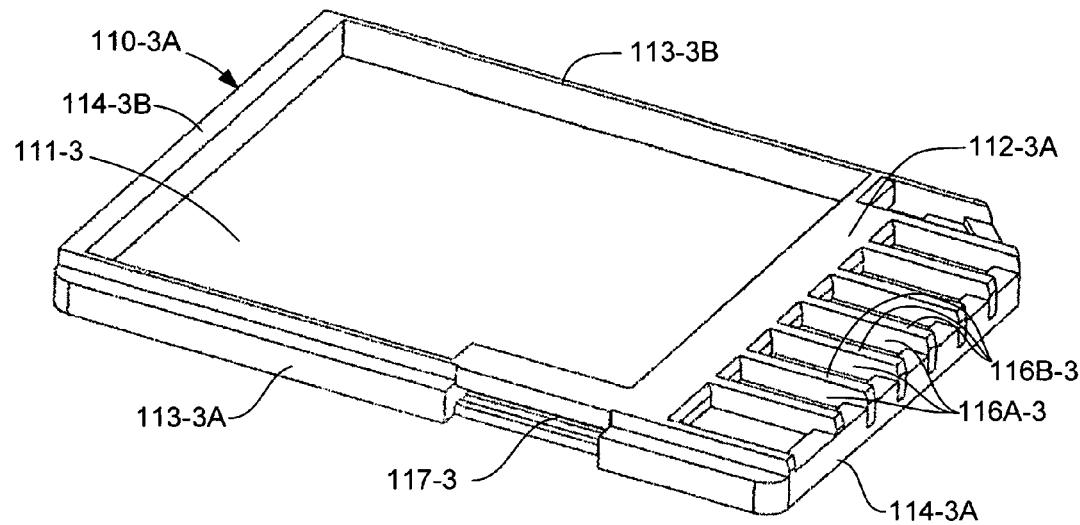
FIG. 15 is a perspective view showing a prefabricated cover having a toe-like pocket according to another embodiment of the present invention.

FIG. 15 shows a prefabricated cover 110-3A according to yet another embodiment of the present invention. Cover 110-3A includes a top wall 111-3, a front wall 114-3A, a rear wall 114-3B, and opposing side walls 113-3A and 113-3B. In addition, prefabricated cover 110-3A includes a toe-like pocket formed by a portion of upper wall 111-3 a first lower wall portion 112-3A, which is connected to front wall 114-3A and extends parallel to upper wall 111-3. First lower wall portion 112-3A defines contact pad windows 116A-3 separated by parallel ribs 116B-3 in a manner similar to that described above.

Figure 16A:
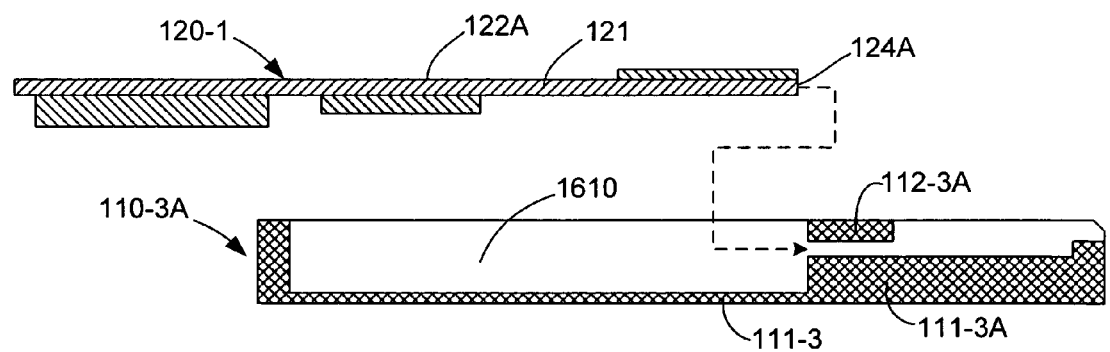
FIGS. 16(A) and 16(B) are cross-sectional side views depicting the formation of a sub-assembly using the cover of FIG. 15.
Figure 16B:
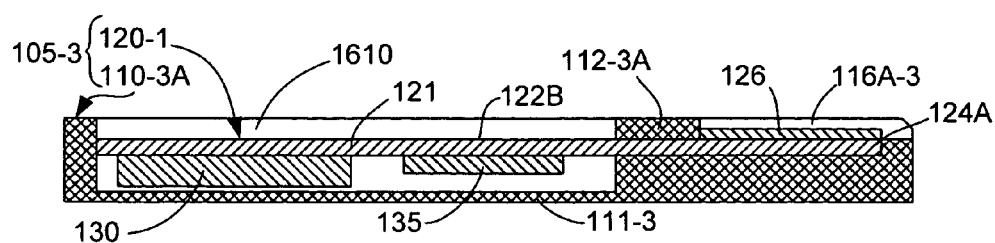

FIGS. 16(A) and 16(B) are cross-sectional side views showing the formation of a sub-assembly 105-3 by inserting front edge 124A of PCBA 120-1 into the toe-like pocket formed by a front portion 111-3A of lower wall 111-3 and first lower wall portion 112-3A. As indicated in FIG. 16(A), front edge 124-A is inserted through an opening 1610 and slid between front portion 111-3A and first lower wall portion 112-3A with lower surface 122A (on the same side where contact pads 126 are located) of PCB substrate 121 facing upward. As shown in FIG. 16(B), the completed sub-assembly includes PCBA 120-1 mounted inside cover 110-3A such that contact pads 126 are aligned with windows 116A-3, and integrated circuits 130 and 135 are mounted inside opening 1610 such that they extend toward upper wall 111-3.

Figure 17A:
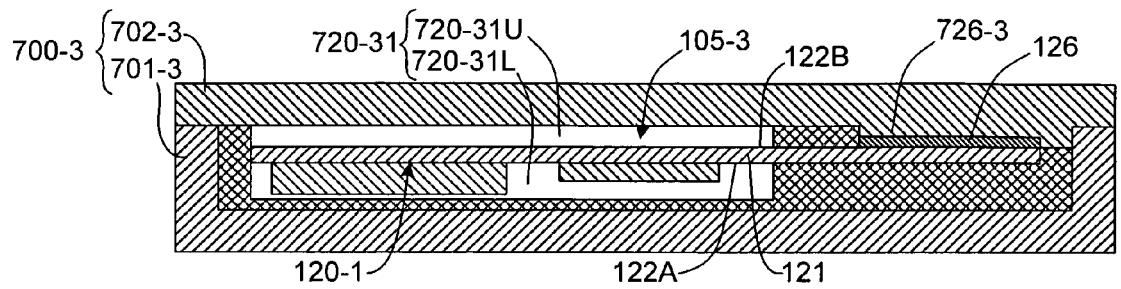
FIGS. 17(A), 17(B), and 17(C) are cross-sectional side views showing the sub-assembly of FIG. 16(B) during a molding process.
Figure 17B:
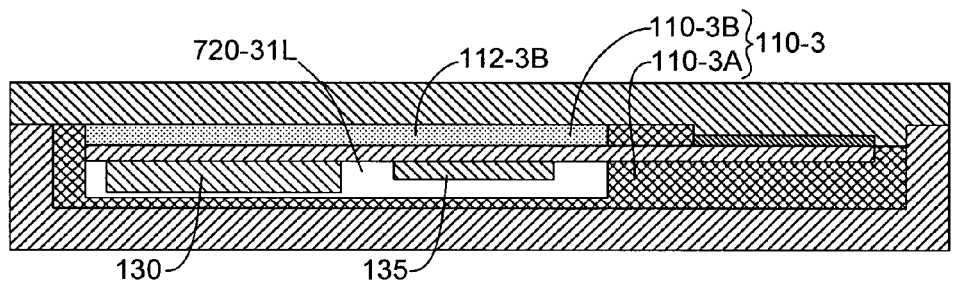
Figure 17C:
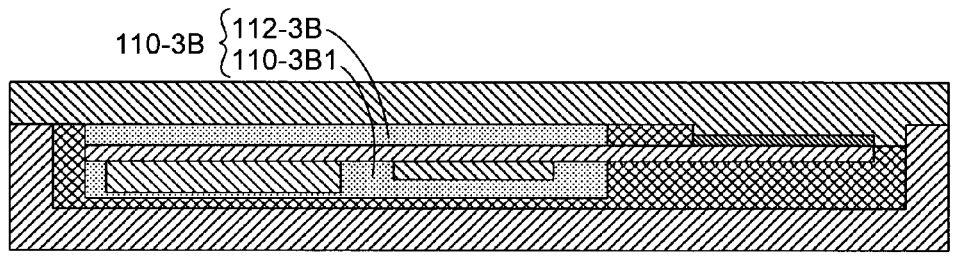

FIGS. 17(A) through 17(C) depict sub-assembly 105-3 mounted inside of a mold assembly 700-3 before and after a molding process during which a molded casing 110-3B is formed that includes a second lower wall portion 112-3B located on lower surface 122B of the PCB substrate 121. As indicated in FIG. 17(A) mold assembly 700-3 includes a lower die 701-3 and an upper die 702-3 that define a cavity 720-31 into which assembly 105-3 is received. Note that an empty cavity region 720-31U is formed between lower surface 122B of PCB substrate 121 and upper die 702-2, and an optional second empty region is defined between upper surface 122A and lower die 701-3. Note also that contact pads 126 of PCBA 120-1 are contacted by column-like structures 726-3, similar to those described above, which extend downward from upper die 702-3. Molded casing 110-3B is then formed using the plastic injection methods discussed above, which combines with cover 110-3A to form a completed housing 110-3. In the embodiment shown in FIG. 17(B), molded casing 110-3B includes a second lower wall portion 112-3B formed on the exposed portion of lower surface 122B. By forming molded casing 110-3B only on lower surface 122B, integrated circuits 130 and 135 are protected from excessive heat and pressure generated during the molding process. In an optional embodiment illustrated in FIG. 17(C), the molded casing 110-3B includes a casing portion 110-3B1 that is located between upper surface 122A and upper wall 111-3. The benefit of this structure is similar to that described above (i.e., increased strength and rigidity, and also more security due to molded plastic formed over the leads connecting the integrated circuits to the PCB substrate). FIG. 18 is a bottom perspective view showing first lower wall portion 112-3A and second lower wall portion 112-3B collectively forming a lower surface of completed memory card 100-3.

Although the present invention has been described with respect to certain other specific SD-type memory card embodiments, it will be clear to those skilled in the art that the inventive features of the present invention are applicable to other memory card structures as well, all of which are intended to fall within the scope of the present invention. For example, according to another aspect of the invention, the disclosed method may be used to form memory cards USB memory card form factors, and "memory stick" form factors. FIGS. 19 and 20 illustrate an exemplary USB memory device 100-4 in which a cover 110-4A includes a relatively large back section 110-4A1 and a toe-like front portion 110-4A2 that communicates with back section 110-4A1 in a manner similar to that described above with reference to memory card 100-3. As shown in FIG. 19, a PCBA 120-4 includes several contact pads 126-4 formed on a front PCB substrate portion 121-4A, and various integrated circuits (e.g., memory circuit 130-4 and controller 135-4) are mounted on a rear PCB substrate portion 121-4B. Front PCB substrate portion 120-4 is then inserted through back section 110-4A1 such that, as shown in FIG. 20, contact pads 126-4 are exposed through windows 116-4 defined in toe-like front portion 110-4A2. A molded casing 110-4B is then formed over PCBA 120-4 in the manner described above to complete the production of USB memory device 100-4.

In addition to the specific embodiments described above, other combinations of the features associated with the present invention may be advantageously combined. For example, the switch structures described with reference to FIGS. 12 and 13 may be utilized in any of the memory card structures described herein. Those skilled in the art will recognize that numerous alternative switch structures may be utilized in place of be specific switch structures discussed above without changing the spirit and scope of the present invention.

The invention claimed is:

1. A method for fabricating a memory card, the method comprising:

forming a cover defining a plurality of windows and a printed circuit board assembly (PCBA) including a printed circuit board (PCB) substrate having opposing first and second surfaces and opposing front and back edges, wherein the PCBA also includes a plurality of contact pads mounted on the second surface and arranged along the front edge of the PCB substrate;

forming a sub-assembly by mounting the PCBA onto the cover such that at least one contact pad of the plurality of contact pads is exposed through an associated window of the plurality of windows; and injecting molten plastic onto at least one of the first surface and the second surface of the PCBA such that the molten plastic secures the PCBA to the cover.

2. The method according to claim 1, wherein forming the first PCBA further comprises mounting one or more integrated circuits on the first surface of the PCB substrate, wherein forming the cover comprises forming a lower wall defining the windows, and wherein forming the sub-assembly comprises mounting the PCB substrate onto the lower wall of the cover such that the contact pads are exposed through the windows and the integrated circuits extend away from the lower wall.

3. The method according to claim 2, wherein forming the cover comprises forming a plurality of identical prefabricated covers including said cover, each prefabricated cover being connected to a carrier strip by an associated connecting segment.

4. The method according to claim 2, wherein forming the sub-assembly comprises positioning the PCBA in the cover such that a rear section of the PCB substrate defines a first plane, and such that a front section of the PCB substrate defines a second plane that extends at an acute angle relative to the first plane.

5. The method according to claim 4, wherein forming the sub-assembly further comprises mounting the PCBA such that the front edge of the PCB substrate is maintained at a first height relative to a lower surface of the lower wall, and such that the rear edge of the PCB substrate is maintained at a second height relative to the lower surface of the lower wall, wherein the first height is greater than the second height.

6. The method according to claim 2, wherein injecting said molten plastic comprises forming a molded casing including an upper wall located over the integrated circuits.

7. The method according to claim 2, forming said cover further comprises forming a second prefabricated cover including an upper wall;

wherein forming the sub-assembly comprises mounting the second prefabricated cover such that the PCBA is positioned between the upper and lower walls; and wherein injecting the molten plastic comprises forming an intermediate casing portion between the upper and lower walls.

8. The method according to claim 1, wherein forming the cover comprises forming a plurality of identical prefabricated covers including said cover, each prefabricated cover being connected to a carrier strip by an associated connecting segment; and wherein the method further comprises mounting the plurality of prefabricated covers into a multi-chamber molding assembly such that each cover is received in a corresponding chamber of the multi-chamber molding assembly, and such that said associated connecting segment of each prefabricated cover extends through a groove formed in a wall surrounding the corresponding chamber.

9. The method according to claim 1,
wherein forming the prefabricated cover comprises forming a switch base on a side wall of the prefabricated cover, and
wherein the method further comprising attaching a movable switch portion to the switch base.

10. The method according to claim 9,
wherein forming the switch base comprises forming an elongated slot, and
wherein attaching the movable switch portion to the switch base comprises engaging a rail portion into the elongated slot such that a handle portion extends out of the elongated slot.

11. The method according to claim 9,
wherein forming the switch base comprises forming an elongated rail, and
wherein attaching the movable switch portion to the switch base comprises mounting the movable switch portion such that the elongated rail of the switch base is slidably received inside an elongated opening defined in the movable switch portion.

12. The method according to claim 1,
wherein forming the first PCBA further comprises mounting one or more integrated circuits on the first surface of the PCB substrate,
wherein forming the cover comprises forming an upper wall, a front wall, and a first lower wall portion connected to the front wall and extending parallel to the upper wall, wherein the first lower wall portion defines the windows, and
wherein forming the sub-assembly comprises mounting the PCB substrate onto the cover such the front edge of the PCB substrate is inserted between the upper wall and the first lower wall portion with the second surface facing away from the upper wall such that the contact pads are exposed through the windows and the integrated circuits extend toward the upper wall.

13. The method according to claim 12, wherein injecting said molten plastic comprises forming a molded casing including a second lower wall portion formed on the second surface of the PCB substrate.

14. The method according to claim 1, wherein the memory card is a Secure Digital (SD) memory card.

15. The method according to claim 1, wherein the memory card is a Universal Serial Bus (USB) memory device.

16. The method according to claim 1, wherein the memory card is a memory stick.

* * * * *